United States Patent
Mori et al.

(10) Patent No.: US 9,915,706 B2
(45) Date of Patent: Mar. 13, 2018

(54) MAGNETIC SENSOR

(71) Applicant: Murata Manufacturing Co., Ltd., Nagaokakyo-shi, Kyoto-fu (JP)

(72) Inventors: Daisuke Mori, Nagaokakyo (JP); Syuji Okabe, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/358,243

(22) Filed: Nov. 22, 2016

(65) Prior Publication Data

US 2017/0074947 A1 Mar. 16, 2017

Related U.S. Application Data

(63) Continuation of application No. PCT/JP2015/063543, filed on May 12, 2015.

(30) Foreign Application Priority Data

May 30, 2014 (JP) ................................. 2014-112573

(51) Int. Cl.
*G01R 33/02* (2006.01)
*G01R 33/00* (2006.01)
(Continued)

(52) U.S. Cl.
CPC ..... *G01R 33/0005* (2013.01); *G01R 33/0023* (2013.01); *G01R 33/09* (2013.01); *H01L 43/08* (2013.01)

(58) Field of Classification Search
CPC ... G01R 33/093; G01R 33/0005; G01R 33/09
(Continued)

(56) References Cited

U.S. PATENT DOCUMENTS 5,684,397 A * 11/1997 Ishishita ............... G01D 5/142
324/252
6,819,101 B2 * 11/2004 Yokotani ............... G01D 5/145
324/207.22
(Continued)

FOREIGN PATENT DOCUMENTS

JP 09-102638 A 4/1997
JP 11-274598A A 10/1999
(Continued)

OTHER PUBLICATIONS

Official Communication issued in corresponding International Application PCT/JP2015/063543, dated Jul. 7, 2015.

*Primary Examiner* — Reena Aurora
(74) *Attorney, Agent, or Firm* — Keating & Bennett, LLP

(57) ABSTRACT

Each of a plurality of first magnetoresistive elements includes a double spiral pattern in plan view. The double spiral pattern includes a first spiral pattern, a second spiral pattern, and an S-shaped or inverted S-shaped pattern that joins the first spiral pattern and the second spiral pattern at a center portion of the double spiral pattern. Orientations of the double spiral patterns of the plurality of first magnetoresistive elements are different from each other in a circumferential direction, and orientations of the S-shaped or inverted S-shaped patterns differ from each other in the circumferential direction.

19 Claims, 15 Drawing Sheets

(51) Int. Cl.
*G01R 33/09* (2006.01)
*H01L 43/08* (2006.01)

(58) Field of Classification Search
USPC .......................................................... 324/252
See application file for complete search history.

(56) References Cited

U.S. PATENT DOCUMENTS

| | | |
|---|---|---|
| 2005/0270018 A1 | 12/2005 | Tatenuma et al. |
| 2010/0141251 A1 | 6/2010 | Ando et al. |
| 2015/0115949 A1 | 4/2015 | Itagaki |

FOREIGN PATENT DOCUMENTS

| | | |
|---|---|---|
| JP | 2005-351656 A | 12/2005 |
| JP | 2010-008161 A | 1/2010 |
| JP | 2012-088225 A | 5/2012 |
| JP | 2013-250182 A | 12/2013 |
| WO | 2009/031539 A1 | 3/2009 |
| WO | 2013/171977 A1 | 11/2013 |

* cited by examiner

FIG.3
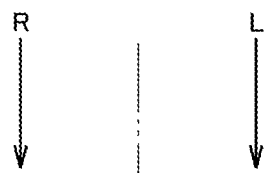
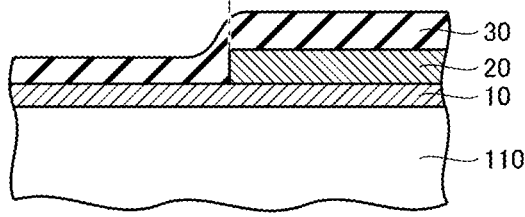
FIG.4
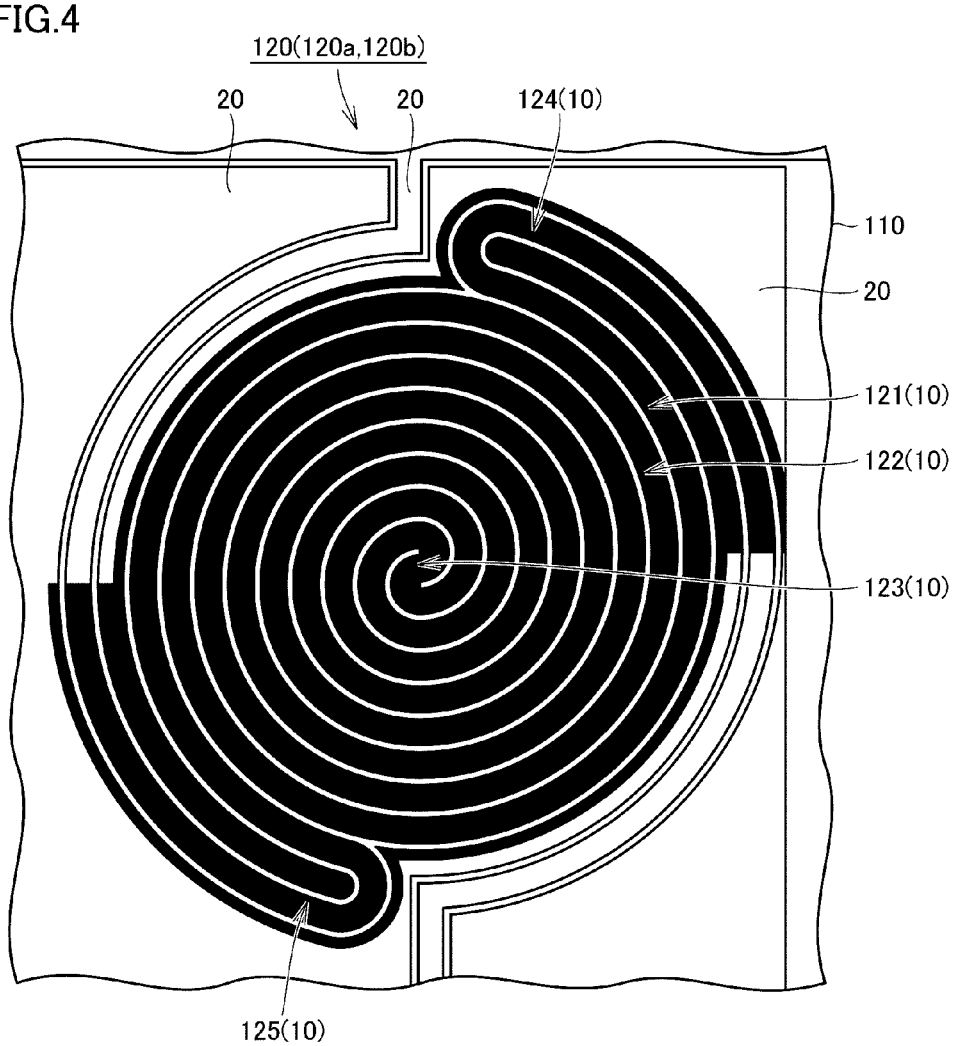

MAGNETIC SENSOR

CROSS REFERENCE TO RELATED APPLICATIONS

This application claims the benefit of priority to Japanese Patent Application No. 2014-112573 filed May 30, 2014 and is a Continuation Application of PCT Application No. PCT/JP2015/063543 filed on May 12, 2015. The entire contents of each application are hereby incorporated herein by reference.

BACKGROUND OF THE INVENTION

1. Field of the Invention

The present invention relates to magnetic sensors, and particularly relates to a magnetic sensor including a magnetoresistive element.

2. Description of the Related Art

Japanese Unexamined Patent Application Publication No. 11-274598, Japanese Unexamined Patent Application Publication No. 9-102638, International Publication No. WO 2013/171977, Japanese Unexamined Patent Application Publication No. 2012-88225, and Japanese Unexamined Patent Application Publication No. 2013-250182 disclose magnetic sensors aiming at improvement in magnetic field detection isotropy.

In a magnetic sensor disclosed in Japanese Unexamined Patent Application Publication No. 11-274598, a pattern of a magnetoresistive element has a spiral shape. Both end portions of the spiral pattern are respectively provided in outermost portions on the opposite sides to each other. The pattern of the magnetoresistive element is substantially defined by only a curvature portion.

In a magnetic sensor disclosed in Japanese Unexamined Patent Application Publication No. 9-102638, a magnetoresistive element is spirally wound in a plurality of turns to have a circular shape, and is deposited so as to be isotropic with respect to an external magnetic field.

In a magnetic sensor disclosed in International Publication No. WO 2013/171977, each of a plurality of magnetoresistive elements in a bridge circuit is configured such that a plurality of sections extending along a direction substantially orthogonal to a magnetic field detection direction as a whole are aligned in parallel to each other at a predetermined interval and are joined together so as to be successively folded back, and in each of the plurality of sections, a plurality of portions provided along the magnetic field detection direction are aligned in parallel to each other at a predetermined interval and are joined together so as to be successively folded back, thereby being formed in an electrically-connected zig-zag pattern.

A magnetic sensor disclosed in Japanese Unexamined Patent Application Publication No. 2012-88225 includes two magnetoresistive elements that are connected in parallel, and each of which has a shape in which semicircle arc patterns having different diameters are continuously joined.

In a magnetic sensor disclosed in Japanese Unexamined Patent Application Publication No. 2013-250182, the center of a first sensing section having a regular octagon shape matches the center of a second sensing section having a regular octagon shape, and the first sensing section is arranged in an outer side portion of the second sensing section. A linear layout of a second magnetoresistive element of the second sensing section is slanted by 22.5 degrees relative to a linear layout of a first magnetoresistive element of the first sensing section.

It is not described explicitly or implicitly in Japanese Unexamined Patent Application Publication No. 11-274598 and Japanese Unexamined Patent Application Publication No. 9-102638 to configure a magnetic sensor by using a plurality of magnetoresistive elements. There is still room for improvement in magnetic field detection isotropy of the magnetic sensors disclosed in International Publication No. WO 2013/171977, Japanese Unexamined Patent Application Publication No. 2012-88225, and Japanese Unexamined Patent Application Publication No. 2013-250182.

SUMMARY OF THE INVENTION

Preferred embodiments of the present invention provide a magnetic sensor in which magnetic field detection isotropy is improved.

A magnetic sensor according to a preferred embodiment of the present invention includes a plurality of magnetoresistive elements that are electrically connected to each other to provide a bridge circuit. The plurality of magnetoresistive elements include a plurality of first magnetoresistive elements and a plurality of second magnetoresistive elements. A resistance change rate of each of the plurality of first magnetoresistive elements is greater than a resistance change rate of each of the plurality of second magnetoresistive elements. Each of the plurality of first magnetoresistive elements includes a double spiral pattern in plan view. The double spiral pattern includes a first spiral pattern, a second spiral pattern, and an S-shaped or inverted S-shaped pattern that joins the first spiral pattern and the second spiral pattern at a center portion of the double spiral pattern. Orientations of the double spiral patterns of the plurality of first magnetoresistive elements are different from each other in a circumferential direction, and orientations of the S-shaped or inverted S-shaped patterns differ from each other in the circumferential direction.

In a preferred embodiment of the present invention, the plurality of first magnetoresistive elements includes two first magnetoresistive elements. The orientations of the double spiral patterns of the two first magnetoresistive elements are different from each other in the circumferential direction by about 90 degrees, and the orientations of the S-shaped or inverted S-shaped patterns differ from each other by about 90 degrees in the circumferential direction.

In another preferred embodiment of the present invention, the double spiral pattern includes length-adjustment redundant portions that adjust the length of the double spiral pattern in a circumference portion of the first spiral pattern and a circumference portion of the second spiral pattern. The first spiral pattern and the second spiral pattern are respectively curved and folded back. The length-adjustment redundant portion provided in the first spiral pattern and the length-adjustment redundant portion provided in the second spiral pattern are positioned on the opposite sides to each other in a radial direction of the double spiral pattern.

In another preferred embodiment of the present invention, each of the plurality of second magnetoresistive elements includes at least one unit pattern that is defined by being folded back while including a plurality of bending sections. The unit pattern does not include a linearly extended section whose length is no less than about 10 µm.

In another preferred embodiment of the present invention, the unit pattern is bent at each of the plurality of bending sections.

In another preferred embodiment of the present invention, the unit pattern is curved at each of the plurality of bending sections.

In another preferred embodiment of the present invention, each of the plurality of second magnetoresistive elements includes a plurality of unit patterns. The plurality of unit patterns are arranged on or substantially on a virtual circle and are connected to each other.

In another preferred embodiment of the present invention, each of the plurality of second magnetoresistive elements includes the plurality of unit patterns. The plurality of unit patterns are arranged on or substantially on a virtual polygon and are connected to each other.

In another preferred embodiment of the present invention, each of the plurality of second magnetoresistive elements includes the plurality of unit patterns. The plurality of unit patterns are arranged on or substantially on a virtual straight line and are connected to each other.

According to various preferred embodiments of the present invention, magnetic field detection isotropy is able to be improved.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a cross-sectional view showing a lamination structure of a connecting portion between a magnetoresistive element and wiring in a bridge circuit of the magnetic sensor according to the first preferred embodiment of the present invention.

FIG. 4 is a plan view showing a pattern in a first magnetoresistive element of the magnetic sensor according to the first preferred embodiment of the present invention.

DETAILED DESCRIPTION OF THE PREFERRED EMBODIMENTS

Figure 1:
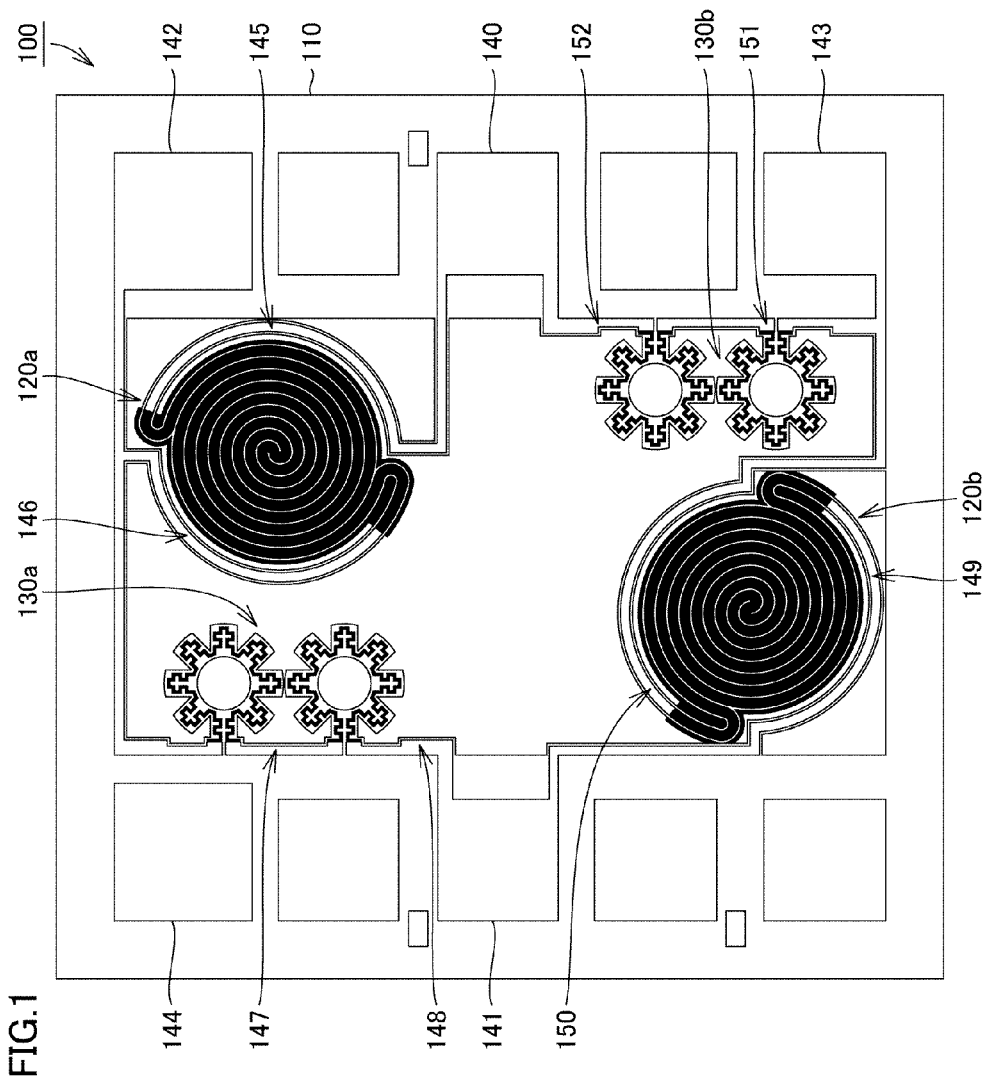
FIG. 1 is a plan view showing patterns of four magnetoresistive elements of a bridge circuit of a magnetic sensor according to a first preferred embodiment of the present invention.

Hereinafter, the present invention will be clarified through description of specific preferred embodiments of the present invention with reference to the drawings. Note that in the following description of the preferred embodiments, identical or corresponding portions in the drawings are assigned the same reference signs and description thereof will not be repeated.

First Preferred Embodiment

Figure 2:
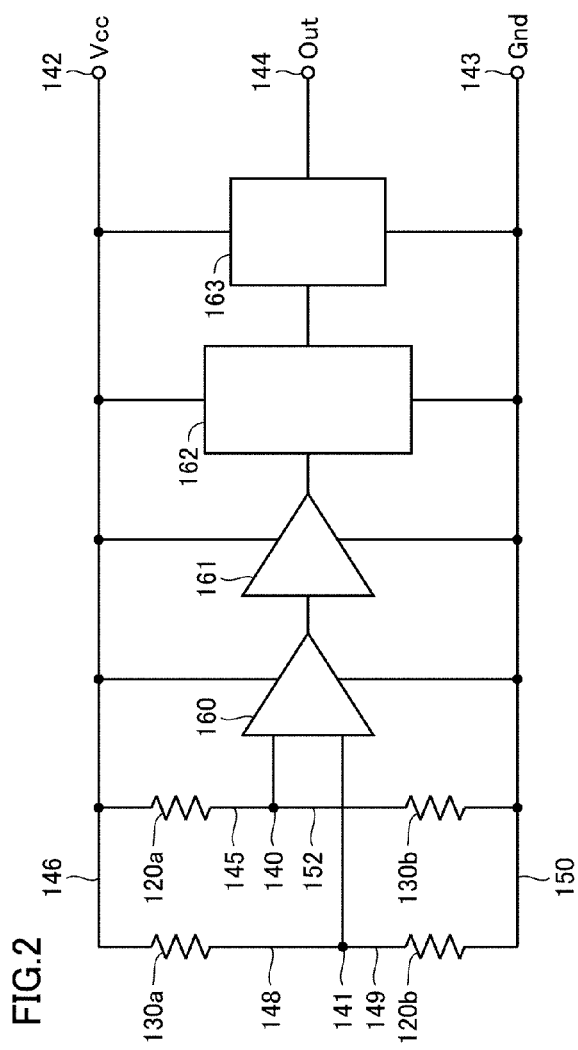
FIG. 2 is an equivalent circuit diagram of the magnetic sensor according to the first preferred embodiment of the present invention.

FIG. 1 is a plan view showing patterns of four magnetoresistive elements of a bridge circuit of a magnetic sensor according to a first preferred embodiment of the present invention. FIG. 2 is an equivalent circuit diagram of the magnetic sensor according to the first preferred embodiment.

As shown in FIGS. 1 and 2, a magnetic sensor 100 according to the first preferred embodiment includes four magnetoresistive elements that are electrically connected to each other to define a bridge circuit. The bridge circuit is, for example, a Wheatstone bridge circuit. The four magnetoresistive elements preferably include two first magnetoresistive elements 120a, 120b and two second magnetoresistive elements 130a, 130b.

A resistance change rate of each of the two first magnetoresistive elements 120a and 120b is preferably greater than a resistance change rate of each of the two second magnetoresistive elements 130a and 130b. Each of the two first magnetoresistive elements 120a and 120b is a magnetosensitive resistance whose electric resistance value changes in response to an external magnetic field applied thereto. Each of the two second magnetoresistive elements 130a and 130b is a fixed resistance whose electric resistance value is constant or substantially constant even if an external magnetic field is applied thereto.

The four magnetoresistive elements are electrically connected to each other with wiring provided on a substrate 110. More specifically, the first magnetoresistive element 120a and the second magnetoresistive element 130a are connected in series with wiring 146. The first magnetoresistive element 120b and the second magnetoresistive element 130b are connected in series with wiring 150.

The magnetic sensor 100 further includes a middle point 140, a middle point 141, a power supply terminal (Vcc) 142, a ground terminal (Gnd) 143, and an output terminal (Out) 144 respectively provided on the substrate 110.

The first magnetoresistive element 120a and the second magnetoresistive element 130b are respectively connected to the middle point 140. More specifically, the first magnetoresistive element 120a is connected to the middle point 140 with wiring 145, and the second magnetoresistive element 130b is connected to the middle point 140 with wiring 152.

The first magnetoresistive element 120b and the second magnetoresistive element 130a are respectively connected to the middle point 141. More specifically, the first magnetoresistive element 120b is connected to the middle point 141 with wiring 149, and the second magnetoresistive element 130a is connected to the middle point 141 with wiring 148.

The wiring 146 is connected to the power supply terminal (Vcc) 142 to which a current is input. The wiring 150 is connected to the ground terminal (Gnd) 143.

As shown in FIG. 2, the magnetic sensor 100 preferably further includes a differential amplifier 160, a temperature compensation circuit 161, a latch and switch circuit 162, and a CMOS (complementary metal oxide semiconductor) driver 163.

Input terminals of the differential amplifier 160 are connected to the middle point 140 and the middle point 141, respectively, and an output terminal of the differential amplifier 160 is connected to the temperature compensation circuit 161. Further, the differential amplifier 160 is connected to the power supply terminal (Vcc) 142 and the ground terminal (Gnd) 143.

An output terminal of the temperature compensation circuit 161 is connected to the latch and switch circuit 162. Further, the temperature compensation circuit 161 is connected to the power supply terminal (Vcc) 142 and the ground terminal (Gnd) 143.

An output terminal of the latch and switch circuit 162 is connected to the CMOS driver 163. Further, the latch and switch circuit 162 is connected to the power supply terminal (Vcc) 142 and the ground terminal (Gnd) 143.

An output terminal of the CMOS driver 163 is connected to the output terminal (Out) 144. Further, the CMOS driver 163 is connected to the power supply terminal (Vcc) 142 and the ground terminal (Gnd) 143.

With the magnetic sensor 100 as described above, a potential difference is generated between the middle point 140 and the middle point 141 depending on the intensity of an external magnetic field. When this potential difference exceeds a predetermined detection level, a signal is output from the output terminal (Out) 144.

FIG. 3 is a cross-sectional view showing a lamination structure of a connecting portion between a magnetoresistive element and wiring in the bridge circuit of the magnetic sensor according to the first preferred embodiment. In FIG. 3, only a connecting portion between a region "R" operating as the magnetoresistive element and a region "L" operating as the wiring is shown.

As shown in FIG. 3, four magnetoresistive elements are provided on the substrate 110 preferably made of Si or the like, for example. A surface of the substrate 110 preferably includes a $SiO_2$ layer, a $Si_3N_4$ layer, or other suitable layer, for example. The four magnetoresistive elements are included in a magnetic body layer 10 that is provided on the substrate 110, preferably includes an alloy of Ni and Fe, for example and is patterned by milling.

The wiring is included in a conductive layer 20 that is provided on the substrate 110, preferably includes Au, Al, or other suitable material, for example, and is patterned by wet etching. The conductive layer 20 is positioned above or immediately above the magnetic body layer 10 in a region where the magnetic body layer 10 is provided, and is positioned above or immediately above the substrate 110 in a region where the magnetic body layer 10 is not provided. Accordingly, as shown in FIG. 3, the conductive layer 20 is positioned above or immediately above the magnetic body layer 10 in the connecting portion between the region R operating as the magnetoresistive element and the region L operating as the wiring.

The middle point 140, the middle point 141, the power supply terminal (Vcc) 142, the ground terminal (Gnd) 143, and the output terminal (Out) 144 are respectively provided with the conductive layer 20 that is positioned above or immediately above the substrate 110.

A Ti layer (not shown) is preferably provided above or immediately above the conductive layer 20. Further, a protection layer 30 preferably including $SiO_2$ or other suitable material, for example, is provided to cover the magnetoresistive elements and the wiring.

FIG. 4 is a plan view showing a pattern of a first magnetoresistive element of the magnetic sensor according to the first preferred embodiment. As shown in FIGS. 1 and 4, each of the two first magnetoresistive elements 120a and 120b includes a double spiral pattern 120 in plan view. The double spiral pattern 120 includes one spiral pattern 121, the other spiral pattern 122, and an inverted S-shaped pattern 123 that joins the one spiral pattern 121 and the other spiral pattern 122 at a center or an approximate center portion of the double spiral pattern 120. The inverted S-shaped pattern 123 does not include a linearly extended section and includes only a curvature portion.

The double spiral pattern 120 includes length-adjustment redundant portions 124 and 125 that adjust the length of the double spiral pattern 120 in a circumference portion of the one spiral pattern 121 and a circumference portion of the other spiral pattern 122. According to the length-adjustment redundant portions 124 and 125, the one spiral pattern 121 and the other spiral pattern 122 are each curved and folded back. The length-adjustment redundant portion 124 provided in the one spiral pattern 121 and the length-adjustment redundant portion 125 provided in the other spiral pattern 122 are positioned on opposite sides to each other in a radial direction of the double spiral pattern 120. Each of the length-adjustment redundant portions 124 and 125 does not include a linearly extended section and only includes a curvature portion.

The double spiral pattern 120 is connected, at the length-adjustment redundant portions 124 and 125, to the conductive layer 20 providing the wiring. An electric resistance value of each of the two first magnetoresistive elements 120a and 120b is able to be adjusted by changing the connecting positions between the conductive layer 20 and the length-adjustment redundant portions 124, 125.

More specifically, the electric resistance value of each of the two first magnetoresistive elements 120a and 120b is able to be decreased as follows: in the connecting portion, shown in FIG. 3, between the region R operating as the magnetoresistive element and the region L operating as the wiring, the conductive layer 20 is extended toward a side of the region R operating as the magnetoresistive element, thereby expanding the region L operating as the wiring. Alternatively, the electric resistance value of each of the two first magnetoresistive elements 120a and 120b are able to be increased as follows: in the connecting portion between the region R operating as the magnetoresistive element and the region L operating as the wiring, the conductive layer 20 is reduced toward a side of the region L operating as the wiring, thereby contracting the region L operating as the wiring.

Because the above-described adjustment of the electric resistance value of each of the two first magnetoresistive elements 120a and 120b is provided by removing a portion of the conductive layer 20 or providing an additional portion to the conductive layer 20, it is preferable that the adjustment be performed before providing the protection layer 30.

As shown in FIG. 4, the double spiral pattern 120 has a substantially point-symmetric shape relative to a center point of the double spiral pattern 120. In other words, the double spiral pattern 120 substantially has a rotationally symmetric or substantially symmetric shape at about 180 degrees relative to the center point of the double spiral pattern 120.

As shown in FIG. 1, orientations of the double spiral patterns 120 of the two first magnetoresistive elements 120a and 120b are different from each other in a circumferential direction. Accordingly, orientations of the inverted S-shaped patterns 123 of the two first magnetoresistive elements 120a and 120b differ from each other.

In the first preferred embodiment, the orientations of the double spiral patterns 120 of the two first magnetoresistive elements 120a and 120b are preferably different from each other in the circumferential direction by about 90 degrees, for example. Accordingly, the orientations of the inverted S-shaped patterns 123 of the two first magnetoresistive elements 120a and 120b differ from each other by about 90 degrees.

Figure 5:
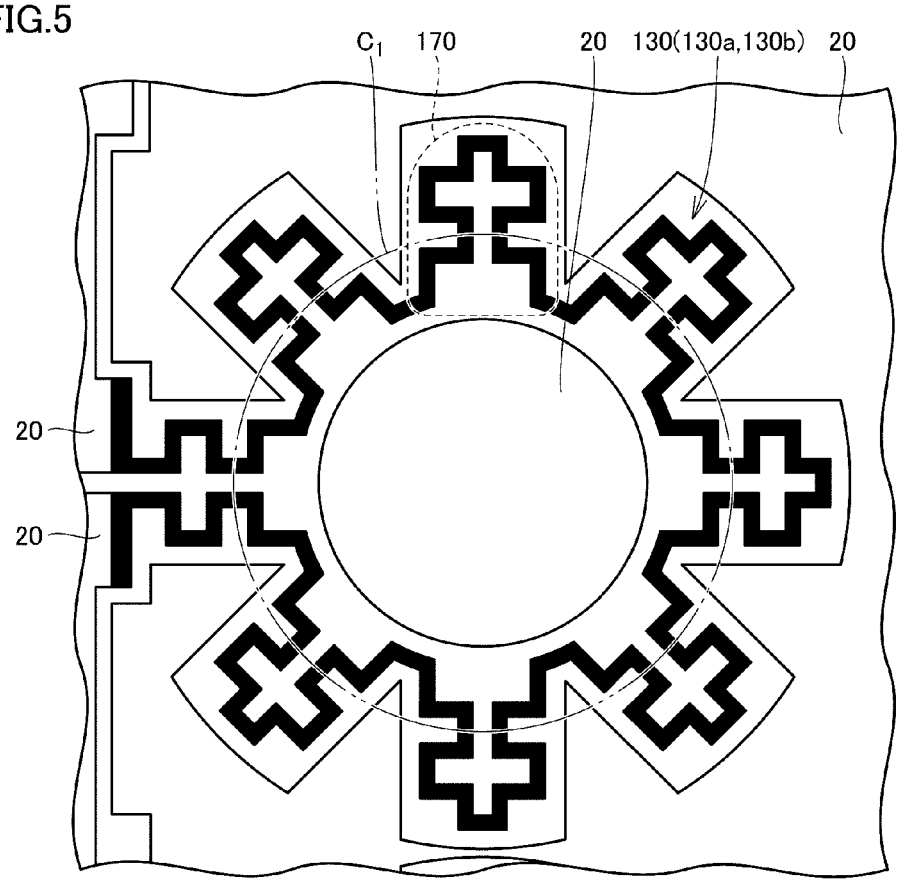
FIG. 5 is a plan view showing a pattern in a second magnetoresistive element of the magnetic sensor according to the first preferred embodiment of the present invention.
Figure 6:
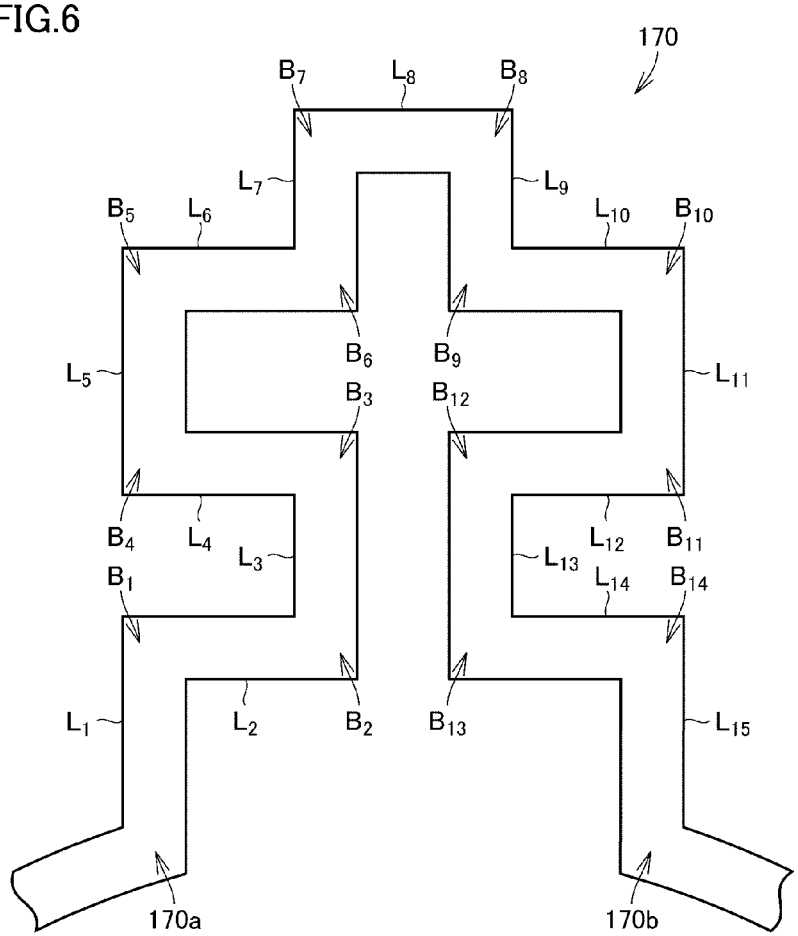
FIG. 6 is a plan view showing a unit pattern included in the pattern in the second magnetoresistive element of the magnetic sensor according to the first preferred embodiment of the present invention.

FIG. 5 is a plan view showing a pattern in a second magnetoresistive element of the magnetic sensor according to the first preferred embodiment. FIG. 6 is a plan view showing a unit pattern included in the pattern in the second magnetoresistive element of the magnetic sensor according to the first preferred embodiment. In FIG. 5, only one of two patterns 130 that include the same or substantially the same shape and are included in each of the two second magnetoresistive elements 130a and 130b is shown.

As shown in FIGS. 1 and 5, in each of the two second magnetoresistive elements 130a and 130b, two patterns 130 of the same or substantially the same shape including eight unit patterns 170 each are connected in series. Each unit pattern 170 is defined by being folded back while including a plurality of bending sections. In the second magnetoresistive element 130a, the two patterns 130 of the same or substantially the same shape are connected to each other with wiring 147. In the second magnetoresistive element 130b, the two patterns 130 of the same or substantially the same shape are connected to each other with wiring 151. With this, each of the two second magnetoresistive elements 130a and 130b provides a desired electric resistance value. As the electric resistance values of the two second magnetoresistive elements 130a and 130b increase, a consumption current in the magnetic sensor 100 is able to be further reduced.

As shown in FIG. 5, the eight unit patterns 170 are preferably arranged on or substantially on a virtual circle $C_1$ and connected to each other. As shown in FIG. 6, the unit pattern 170 is defined by being folded back while including 14 bending sections $B_1$ through $B_{14}$ and 15 linearly extended sections $L_1$ through $L_{15}$ in a pattern route from a starting portion 170a to a terminating portion 170b. In other words, the unit pattern 170 includes a bag shape with the starting portion 170a and the terminating portion 170b as a mouth.

In the first preferred embodiment, the unit pattern 170 is preferably bent at a right angle or approximately a right angle at each of the 14 bending sections $B_1$ through $B_{14}$. The unit pattern 170 preferably does not include a linearly extended section whose length is no less than about 10 μm. In other words, the length of each of the 15 linearly extended sections $L_1$ through $L_{15}$ is preferably shorter than about 10 μm, for example.

However, two patterns that are included in the two second magnetoresistive elements 130a and 130b are not limited to those discussed above, and it is sufficient that the pattern includes at least one unit pattern that is defined by being folded back while including a plurality of bending sections without including a linearly extended section whose length is no less than about 10 μm.

An electric resistance value of a magnetoresistive element changes due to a magnetoresistive effect if a magnetic field is applied at a specific angle relative to a direction in which a current flows through the magnetoresistive element. As the length of the magnetoresistive element in a lengthwise direction increases, the magnetoresistive effect also increases.

Accordingly, with the two second magnetoresistive elements 130a and 130b including the above-described patterns, the magnetoresistive effect is significantly reduced or prevented and the resistance change rate is considerably small in each of the two second magnetoresistive elements 130a and 130b. Thus, the resistance change rate of each of the two first magnetoresistive elements 120a and 120b is greater than the resistance change rate of each of the two second magnetoresistive elements 130a and 130b.

In the magnetic sensor 100 according to the first preferred embodiment, each of the two first magnetoresistive elements 120a and 120b includes the double spiral pattern 120. The double spiral pattern 120 is primarily provided by winding a substantially arc-shaped curvature portion. Because an arc is considered to be an approximate shape in which a polygon includes a number of corners that approaches infinity, the direction of a current flowing through the double spiral pattern 120 covers substantially all directions (that is, about 360 degrees) in a horizontal direction. Accordingly, each of the two first magnetoresistive elements 120a and 120b is able to detect an external magnetic field substantially across all directions (that is, about 360 degrees) in the horizontal direction. The horizontal direction is a direction that is parallel or substantially parallel to the surface of the substrate 110.

Further, in the magnetic sensor 100 according to the first preferred embodiment, the center portion of the double spiral pattern 120 includes the inverted S-shaped pattern 123, which includes only a curvature portion. The circumference portions of the double spiral pattern 120 respectively include the length-adjustment redundant portions 124 and 125, which include only a curvature portion. As discussed above, because none of the two first magnetoresistive elements 120a and 120b include a linearly extended section, anisotropy of magnetic field detection is reduced.

Furthermore, in the magnetic sensor 100 according to the first preferred embodiment, the orientations of the double spiral patterns 120 are different from each other in the circumferential direction. Accordingly, the orientations of the inverted S-shaped patterns 123 of the two first magnetoresistive elements 120a and 120b differ from each other, and isotropy of magnetic field detection is able to be reduced.

As discussed above, the double spiral pattern 120 preferably substantially includes a rotationally symmetric or substantially symmetric shape at about 180 degrees relative to the center point of the double spiral pattern 120. Thus, the two first magnetoresistive elements 120*a* and 120*b* include only a tiny amount of anisotropy in the magnetic field detection.

By orienting of the double spiral pattern 120 of the first magnetoresistive element 120*a* in the circumferential direction differently from the orientation of the double spiral pattern 120 of the first magnetoresistive element 120*b* in the circumferential direction, the magnetic field detection anisotropy in each first magnetoresistive element is able to be reduced by each other.

If the orientation of the double spiral pattern 120 of the first magnetoresistive element 120*a* in the circumferential direction and the orientation of the double spiral pattern 120 of the first magnetoresistive element 120*b* in the circumferential direction are different from each other by about 90 degrees, the magnetic field detection anisotropy in each first magnetoresistive element is able to be significantly reduced or prevented.

According to the orientation described above, a direction in which the first magnetoresistive element 120*a* exhibits the highest sensitivity matches a direction in which the first magnetoresistive element 120*b* exhibits the lowest sensitivity, and a direction in which the first magnetoresistive element 120*a* exhibits the lowest sensitivity matches a direction in which the first magnetoresistive element 120*b* exhibits the highest sensitivity. Thus, when an external magnetic field is applied to the magnetic sensor 100, a variation in a potential difference generated between the middle point 140 and the middle point 141 depending on a direction in which the external magnetic field is applied to the magnetic sensor 100 is able to be significantly reduced or prevented.

In the magnetic sensor 100 according to the first preferred embodiment, preferably, each of the two second magnetoresistive elements 130*a* and 130*b* includes the unit pattern 170 that does not include a linearly extended section whose length is no less than about 10 μm, is bent at a right angle at each of the 14 bending sections $B_1$ through $B_{14}$, and includes a bag shape with the starting portion 170*a* and the terminating portion 170*b* as a mouth.

Thus, a current flowing through the unit pattern 170 in various directions in the horizontal direction is able to be dispersed and the magnetoresistive effect anisotropy in each of the two second magnetoresistive elements 130*a* and 130*b* is able to be reduced. In addition, variation in the output of the magnetic sensor 100 due to the influence of residual magnetization when the external magnetic field is about 0 is able to be significantly reduced or prevented.

Further, by arranging the plurality of unit patterns 170 on or substantially on the virtual circle $C_1$ a current flowing through the pattern 130 in various directions in the horizontal direction is able to be dispersed and the magnetoresistive effect anisotropy in each of the two second magnetoresistive elements 130*a* and 130*b* is able to be reduced.

Figure 7:
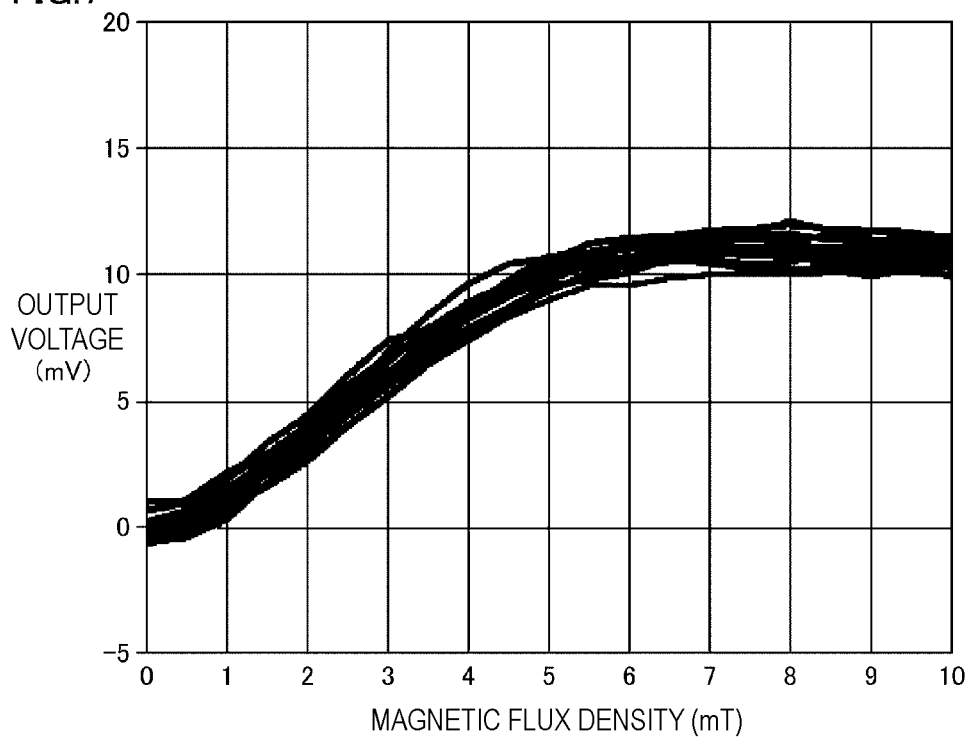
FIG. 7 is a graph showing a result of an experiment in which a direction of an external magnetic field applied to the magnetic sensor according to the first preferred embodiment of the present invention is varied in a range of about 0 degrees to about 337.5 degrees at an interval of about 22.5 degrees in a horizontal direction to determine a relationship between intensity of the external magnetic field and output of the magnetic sensor.

FIG. 7 is a graph showing a result of an experiment in which a direction of an external magnetic field applied to the magnetic sensor 100 according to the first preferred embodiment was varied in a range of about 0 degrees to about 337.5 degrees at an interval of about 22.5 degrees in the horizontal direction to determine a relationship between the intensity of the external magnetic field and the output of the magnetic sensor 100. In FIG. 7, the vertical axis represents an output voltage (mV) of the magnetic sensor 100, and the horizontal axis represents magnetic flux density (mT).

In the magnetic sensor 100 according to the first preferred embodiment, as shown in FIG. 7, even if the application direction of the external magnetic field was varied in a range of about 0 degrees to about 337.5 degrees at the interval of about 22.5 degrees in the horizontal direction, a large change was not observed in the relationship between the intensity of the external magnetic field and the output of the magnetic sensor 100. In other words, improvement in the magnetic field detection isotropy was confirmed in the magnetic sensor 100 according to the first preferred embodiment. It was also confirmed that a variation in the output of the magnetic sensor 100 was significantly reduced or prevented at the time of the external magnetic field being about 0.

Second Preferred Embodiment

Hereinafter, a magnetic sensor according to a second preferred embodiment of the present invention will be described with reference to the drawings. The magnetic sensor according to the second preferred embodiment differs from the magnetic sensor 100 according to the first preferred embodiment only in that a pattern in a second magnetoresistive element is different from that in the first preferred embodiment; as such, description of other elements and features will not be repeated.

Figure 8:
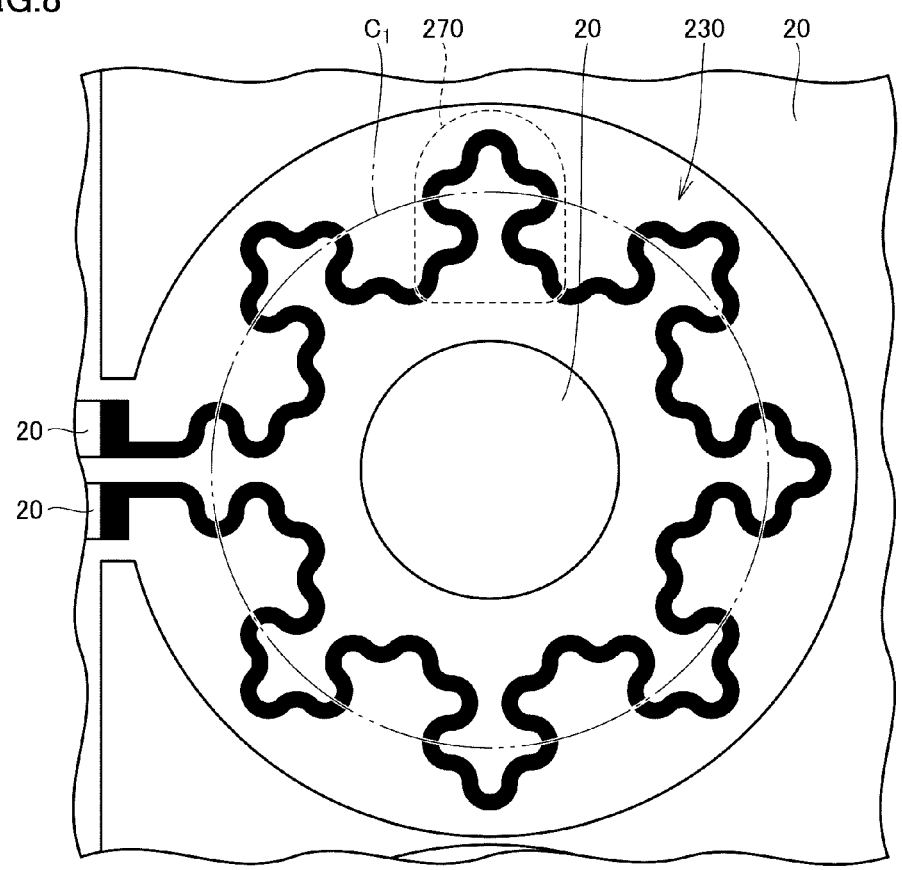
FIG. 8 is a plan view showing a pattern in a second magnetoresistive element of a magnetic sensor according to a second preferred embodiment of the present invention.
Figure 9:
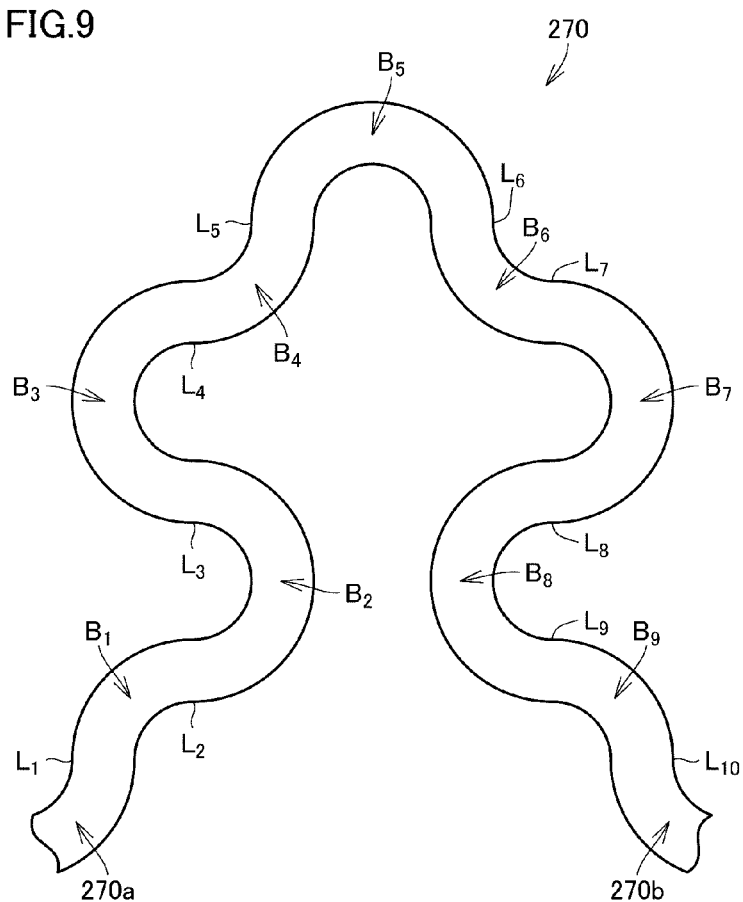
FIG. 9 is a plan view showing a unit pattern included in the pattern in the second magnetoresistive element of the magnetic sensor according to the second preferred embodiment of the present invention.

FIG. 8 is a plan view showing a pattern in the second magnetoresistive element of the magnetic sensor according to the second preferred embodiment. FIG. 9 is a plan view showing a unit pattern included in the pattern in the second magnetoresistive element of the magnetic sensor according to the second preferred embodiment. In FIG. 8, only one of two patterns 230 that include the same or substantially the same shape in each of two second magnetoresistive elements is shown.

In each of the two second magnetoresistive elements of the magnetic sensor according to the second preferred embodiment, preferably the two patterns 230 of the same or substantially the same shape including eight unit patterns 270 each are connected in series. Each unit pattern 270 is defined by being folded back while including a plurality of bending sections.

As shown in FIG. 8, the eight unit patterns 270 are preferably arranged on or substantially on a virtual circle $C_1$ and connected to each other. As shown in FIG. 9, the unit pattern 270 is defined by being folded back while including nine bending sections $B_1$ through $B_9$ and 10 linearly extended sections $L_1$ through $L_{10}$ in a pattern route from a starting portion 270*a* to a terminating portion 270*b*. In other words, the unit pattern 270 has a bag shape with the starting portion 270*a* and the terminating portion 270*b* as a mouth.

In the second preferred embodiment, the unit pattern 270 is bent at each of the nine bending sections $B_1$ through $B_9$. The unit pattern 270 preferably does not include a linearly extended section whose length is no less than about 10 μm. In other words, the length of each of the 10 linearly extended sections $L_1$ through $L_{10}$ is preferably shorter than about 10 μm, for example.

In the magnetic sensor according to the second preferred embodiment, the bending sections of the unit pattern 270 included in the second magnetoresistive element are curved. Accordingly, a current flowing through the unit pattern 270 in various directions in the horizontal direction is able to be further dispersed and the magnetoresistive effect anisotropy of the second magnetoresistive element is able to be further reduced in comparison with the second magnetoresistive element of the magnetic sensor 100 according to the first preferred embodiment.

Third Preferred Embodiment

Hereinafter, a magnetic sensor according to a third preferred embodiment of the present invention will be described with reference to the drawings. The magnetic sensor according to the third preferred embodiment differs from the magnetic sensor 100 according to the first preferred embodiment only in that a pattern in a second magnetoresistive element is different from that in the first preferred embodiment; as such, description of other elements and features will not be repeated.

Figure 10:
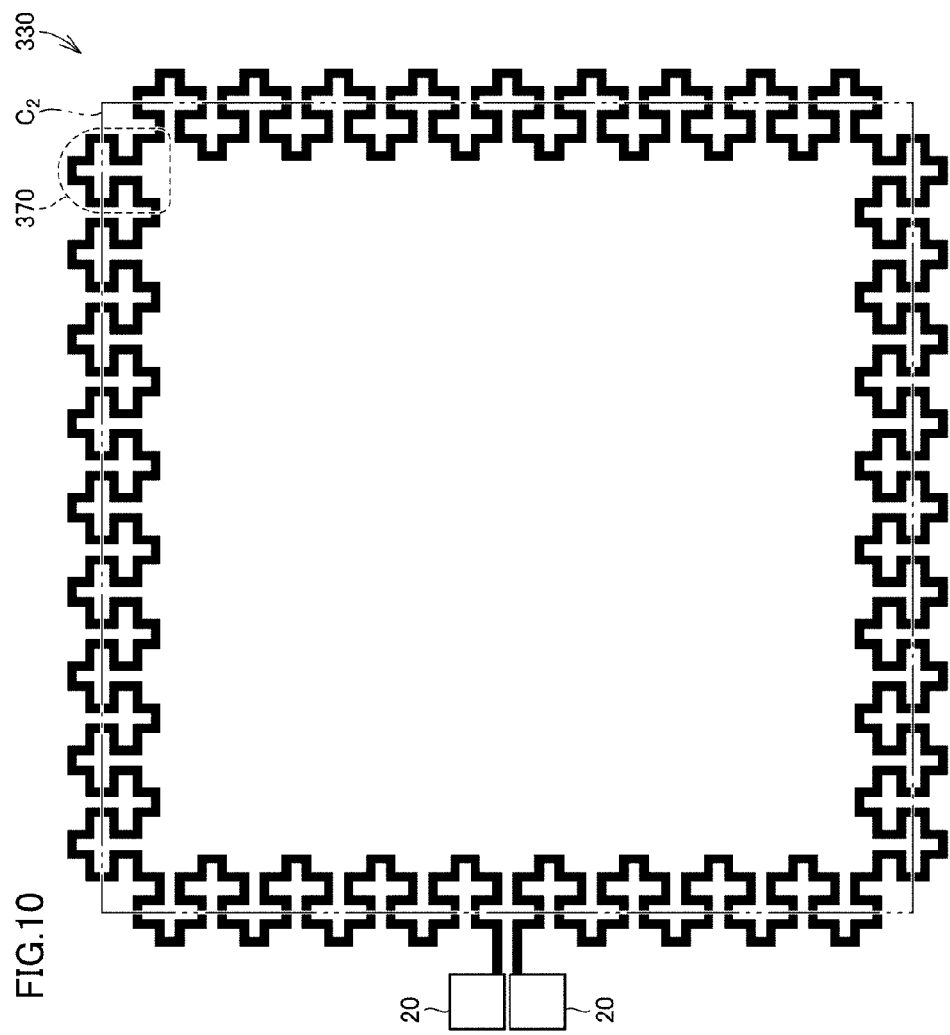
FIG. 10 is a plan view showing a pattern in a second magnetoresistive element of a magnetic sensor according to a third preferred embodiment of the present invention.
Figure 11:
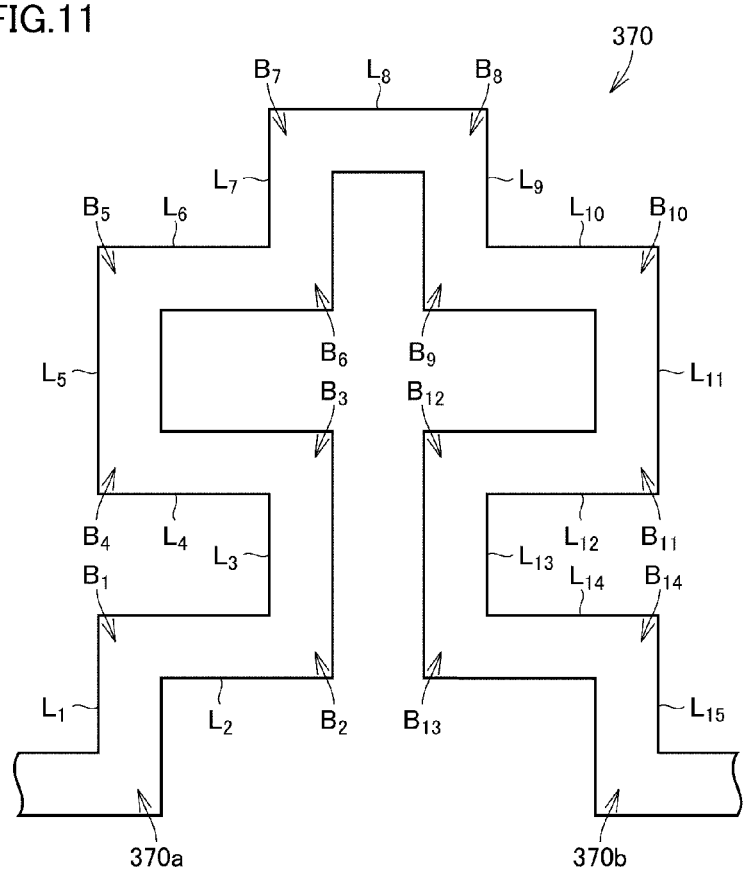
FIG. 11 is a plan view showing a unit pattern included in the pattern in the second magnetoresistive element of the magnetic sensor according to the third preferred embodiment of the present invention.

FIG. 10 is a plan view showing a pattern in the second magnetoresistive element of the magnetic sensor according to the third preferred embodiment. FIG. 11 is a plan view showing a unit pattern included in the pattern in the second magnetoresistive element of the magnetic sensor according to the third preferred embodiment.

As shown in FIG. 10, each of two second magnetoresistive elements of the magnetic sensor according to the third preferred embodiment preferably includes a pattern 330 including 32 unit patterns 370. Each unit pattern 370 is defined by being folded back while including a plurality of bending sections.

As shown in FIG. 10, the 32 unit patterns 370 are preferably arranged on or substantially on a virtual rectangle $C_2$ and connected to each other. The plurality of unit patterns 370 may be arranged on or substantially on a virtual polygon other than a virtual rectangle.

As shown in FIG. 11, the unit pattern 370 is defined by being folded back while including 14 bending sections $B_1$ through $B_{14}$ and 15 linearly extended sections $L_1$ through $L_{15}$ in a pattern route from a starting portion 370a to a terminating portion 370b. In other words, the unit pattern 370 has a bag shape with the starting portion 370a and the terminating portion 370b as a mouth.

In the third preferred embodiment, the unit pattern 370 is preferably bent at a right angle or substantially a right angle at each of the 14 bending sections $B_1$ through $B_{14}$. The unit pattern 370 does not include a linearly extended section whose length is preferably no less than about 10 µm. In other words, the length of each of the 15 linearly extended sections $L_1$ through $L_{15}$ is preferably shorter than about 10 µm, for example.

In the magnetic sensor according to the third preferred embodiment, the plurality of unit patterns 370 included in each of the two second magnetoresistive elements are preferably arranged on or substantially on the virtual rectangle $C_2$. Accordingly, a current flowing through the pattern 330 in various directions in the horizontal direction is able to be dispersed and the magnetoresistive effect anisotropy in each of the two second magnetoresistive elements is able to be reduced.

Fourth Preferred Embodiment

Hereinafter, a magnetic sensor according to a fourth preferred embodiment of the present invention will be described with reference to the drawings. A magnetic sensor 400 according to the fourth preferred embodiment differs from the magnetic sensor 100 according to the first preferred embodiment primarily in that a pattern in a second magnetoresistive element is different from that in the first preferred embodiment; as such, description of other elements and features will not be repeated.

Figure 12:
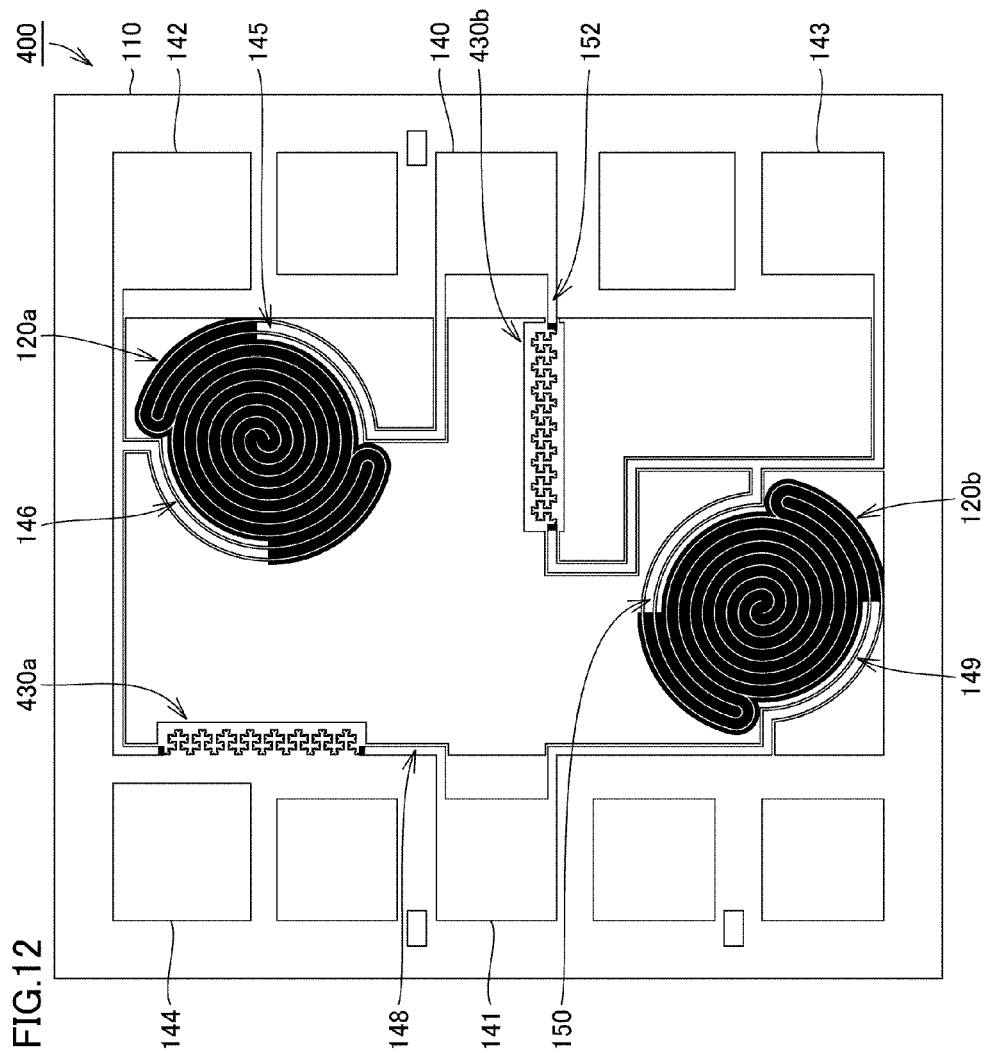
FIG. 12 is a plan view showing patterns of four magnetoresistive elements of a bridge circuit of a magnetic sensor according to a fourth preferred embodiment of the present invention.
Figure 13:
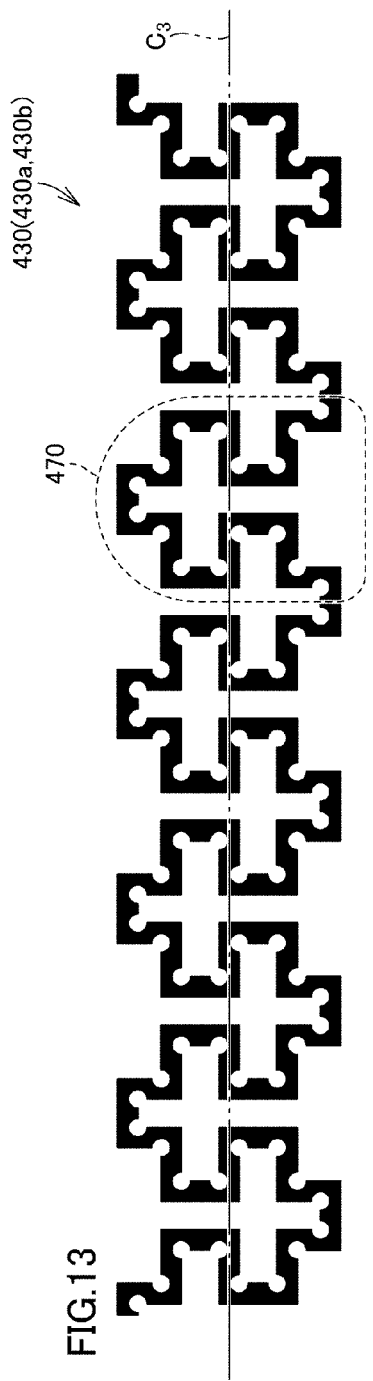
FIG. 13 is a plan view showing a pattern in a second magnetoresistive element of the magnetic sensor according to the fourth preferred embodiment of the present invention.

FIG. 12 is a plan view showing patterns of four magnetoresistive elements providing a bridge circuit of the magnetic sensor according to the fourth preferred embodiment. FIG. 13 is a plan view showing a pattern in the second magnetoresistive element of the magnetic sensor according to the fourth preferred embodiment.

As shown in FIG. 12, each of two second magnetoresistive elements 430a and 430b of the magnetic sensor 400 according to the fourth preferred embodiment preferably includes a pattern 430 including eight unit patterns 470. Each unit pattern 470 is defined by being folded back while including a plurality of bending sections. As shown in FIG. 13, the eight unit patterns 470 are preferably arranged on or substantially on a virtual straight line $C_3$ and connected to each other.

As shown in FIG. 13, the unit pattern 470 according to the fourth preferred embodiment has the same or substantially the same shape as the unit pattern 370 according to the third preferred embodiment. The unit pattern 470 differs from the unit pattern 370 in a point that a round concave portion whose size is equal or substantially equal to the diameter of a tool that mills the magnetic body layer 10 is provided at each bending section.

By providing the above-described concave portions in the unit pattern 470, a path of a current flowing through the unit pattern 470 is able to be lengthened and a width of the unit pattern 470 is able to be narrow at each bending section. Accordingly, an electric resistance value of the unit pattern 470 is able to be increased. As a result, an electric resistance value of each of the two second magnetoresistive elements 430a and 430b is able to be increased.

In the magnetic sensor 400 according to the fourth preferred embodiment, because the plurality of unit patterns 470 included in each of the two second magnetoresistive elements 430a and 430b are arranged on or substantially on the virtual straight line $C_3$, the degree of freedom in the arrangement of each of the two second magnetoresistive elements 430a and 430b is able to be increased.

Fifth Preferred Embodiment

Hereinafter, a magnetic sensor according to a fifth preferred embodiment will be described with reference to the drawings. A magnetic sensor 500 according to the fifth preferred embodiment differs from the magnetic sensor 100 according to the first preferred embodiment primarily in that a pattern in each of a first magnetoresistive element and a second magnetoresistive element is different from that in the first preferred embodiment; as such, description of other elements and features will not be repeated.

Figure 14:
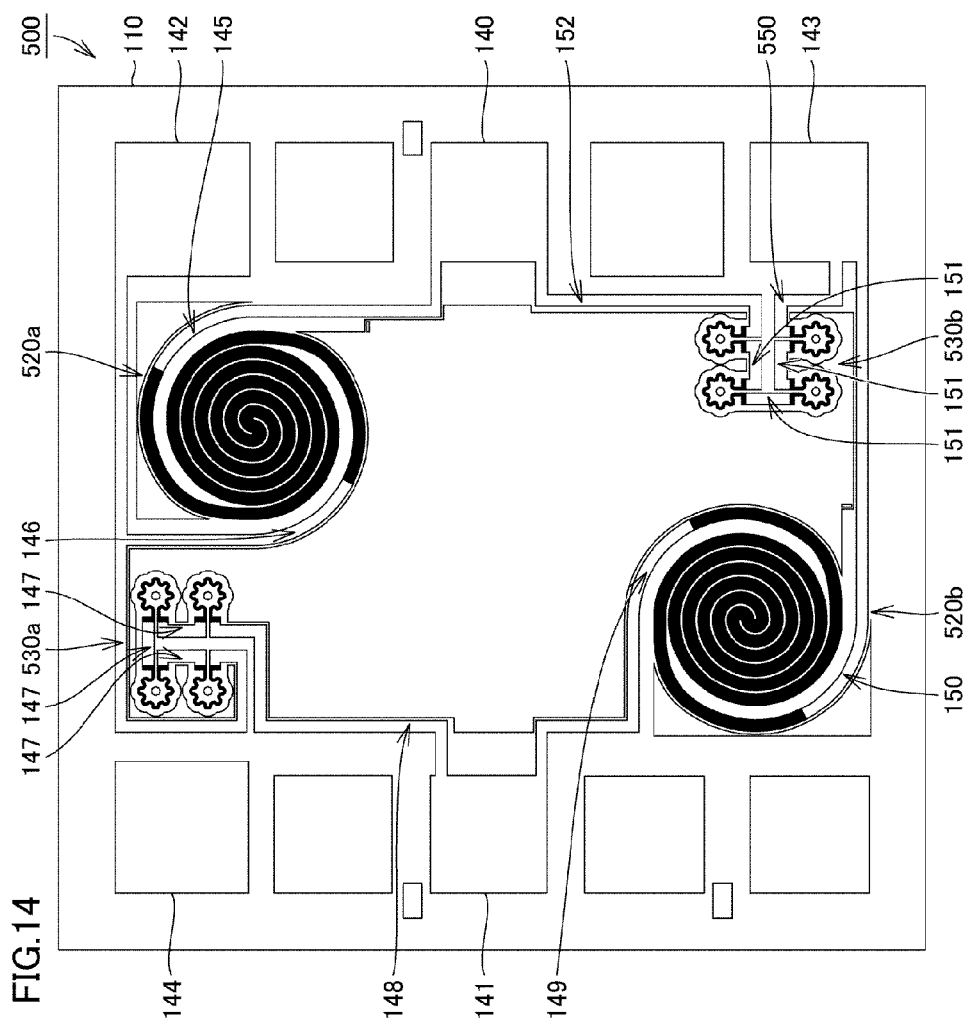
FIG. 14 is a plan view showing patterns of four magnetoresistive elements of a bridge circuit of a magnetic sensor according to a fifth preferred embodiment of the present invention.

FIG. 14 is a plan view showing patterns of four magnetoresistive elements providing a bridge circuit of the magnetic sensor according to the fifth preferred embodiment.

As shown in FIG. 14, the magnetic sensor 500 according to the fifth preferred embodiment preferably includes four magnetoresistive elements that are electrically connected to each other to provide a bridge circuit. The bridge circuit is preferably, for example, a Wheatstone bridge circuit. The four magnetoresistive elements include two first magnetoresistive elements 520a, 520b and two second magnetoresistive elements 530a, 530b.

Figure 15:
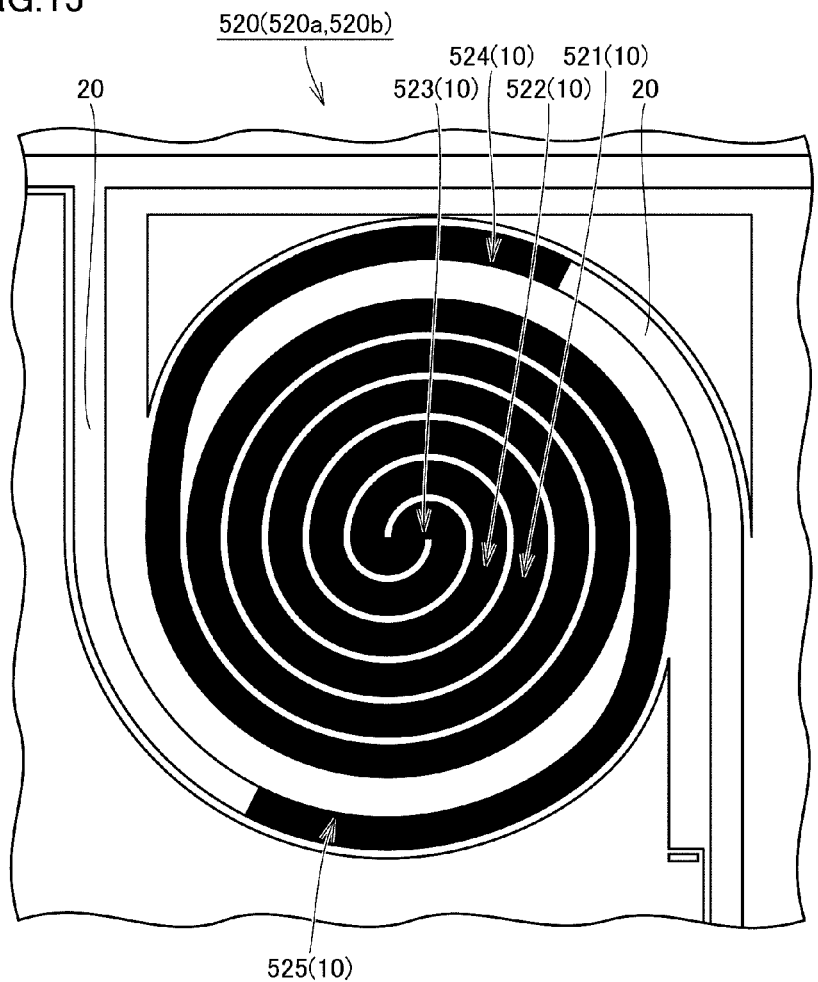
FIG. 15 is a plan view showing a pattern of a first magnetoresistive element of the magnetic sensor according to the fifth preferred embodiment of the present invention.

FIG. 15 is a plan view showing a pattern of the first magnetoresistive element of the magnetic sensor according to the fifth preferred embodiment. As shown in FIGS. 14 and 15, each of two first magnetoresistive elements 520a and 520b includes a double spiral pattern 520 in plan view. The double spiral pattern 520 includes one spiral pattern 521, the other spiral pattern 522, and an S-shaped pattern 523 that joins the one spiral pattern 521 and the other spiral pattern 522 at a center portion of the double spiral pattern 520. The S-shaped pattern 523 does not include a linearly extended section and includes only a curvature portion.

The double spiral pattern 520 includes length-adjustment redundant portions 524 and 525 that adjust the length of the double spiral pattern 520 in a circumference portion of the one spiral pattern 521 and a circumference portion of the other spiral pattern 522. According to the arrangement of the length-adjustment redundant portions 524 and 525, the one spiral pattern 521 and the other spiral pattern 522 are each expanded toward an outer side portion and curved. The length-adjustment redundant portion 524 provided in the one spiral pattern 521 and the length-adjustment redundant portion 525 provided in the other spiral pattern 522 are positioned on the opposite sides to each other in a radial direction of the double spiral pattern 520. Each of the length-adjustment redundant portions 524 and 525 does not include a linearly extended section and includes only a curvature portion.

As shown in FIG. 15, the double spiral pattern 520 preferably has a substantially point-symmetric shape relative to a center point of the double spiral pattern 520. In other words, the double spiral pattern 520 preferably has a rotationally symmetric or substantially symmetric shape at about 180 degrees relative to the center point of the double spiral pattern 520.

As shown in FIG. 14, orientations of the double spiral patterns 520 of the two first magnetoresistive elements 520a and 520b are different from each other in the circumferential direction. Accordingly, orientations of the S-shaped patterns 523 of the two first magnetoresistive elements 520a and 520b differ from each other.

In the fifth preferred embodiment, the orientations of the double spiral patterns 520 of the two first magnetoresistive elements 520a and 520b are different from each other in the circumferential direction by about 90 degrees. Accordingly, the orientations of the S-shaped patterns 523 of the two first magnetoresistive elements 520a and 520b differ from each other by about 90 degrees.

Figure 16:
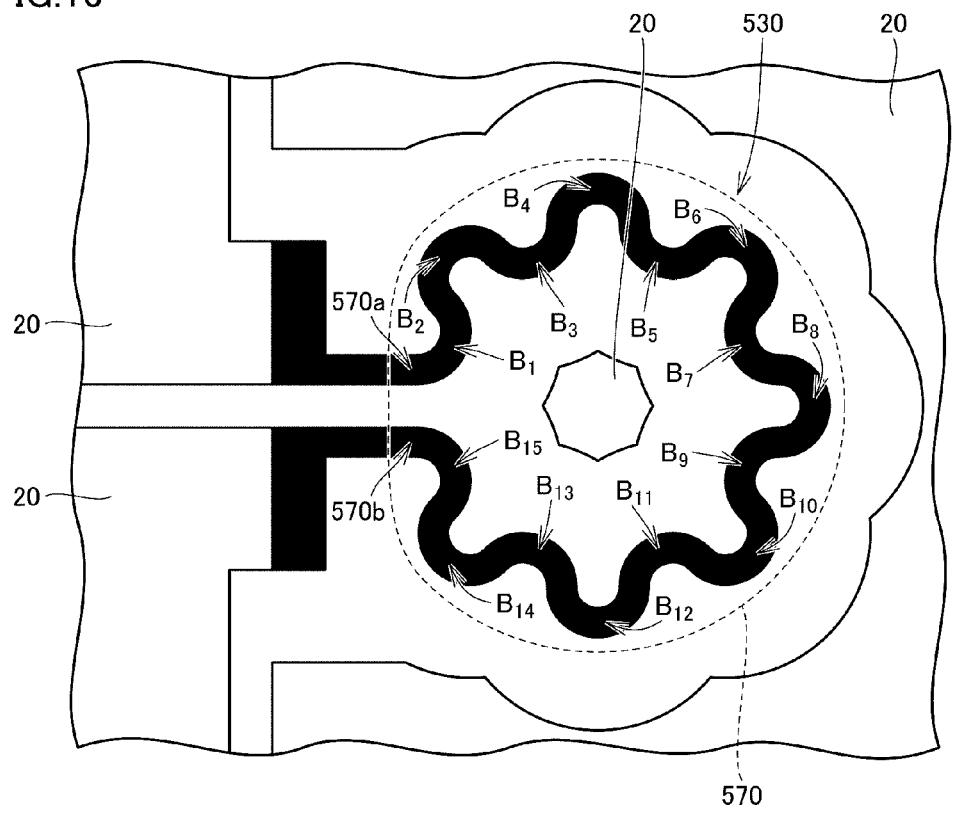
FIG. 16 is a plan view showing a pattern in a second magnetoresistive element of the magnetic sensor according to the fifth preferred embodiment of the present invention.

FIG. 16 is a plan view showing a pattern in the second magnetoresistive element of the magnetic sensor according to the fifth preferred embodiment. In FIG. 16, only one of four patterns 530 that have the same or substantially the same shape in each of the two second magnetoresistive elements 530a and 530b is shown.

As shown in FIGS. 14 and 16, in each of the two second magnetoresistive elements 530a and 530b, the four patterns 530 of the same or substantially the same shape including one unit pattern each are connected in series. Each unit pattern is defined by being folded back while including a plurality of bending sections.

In the second magnetoresistive element 530a, the four patterns 530 of the same or substantially the same shape are connected to each other with the wiring 147. In the second magnetoresistive element 530b, the four patterns 530 of the same or substantially the same shape are connected to each other with the wiring 151. With this, each of the two second magnetoresistive elements 530a and 530b provides a desired electric resistance value.

As shown in FIG. 16, the unit pattern of the pattern 530 is defined by being folded back while including 15 bending sections $B_1$ through $B_{15}$ in a pattern route from a starting portion 570a to a terminating portion 570b. In other words, the unit pattern of the pattern 530 includes a bag shape with the starting portion 570a and the terminating portion 570b as a mouth.

In the fifth preferred embodiment, the unit pattern of the pattern 530 is bent at each of the 15 bending sections $B_1$ through $B_{15}$. The unit pattern of the pattern 530 does not include a linearly extended section.

In the magnetic sensor 500 according to the fifth preferred embodiment, the center portion of the double spiral pattern 520 includes the S-shaped pattern 523, which includes only a curvature portion. The circumference portion of the double spiral pattern 520 includes the length-adjustment redundant portions 524 and 525, each of which includes only a curvature portion. As discussed above, because none of the two first magnetoresistive elements 520a and 520b include a linearly extended section, anisotropy of the magnetic field detection is reduced.

Further, in the magnetic sensor 500 according to the fifth preferred embodiment, the orientations of the double spiral patterns 520 are preferably different from each other in the circumferential direction so that the orientations of the S-shaped patterns 523 of the two first magnetoresistive elements 520a and 520b differ from each other, and isotropy of the magnetic field detection is able to be reduced.

By orienting of the double spiral pattern 520 of the first magnetoresistive element 520a in the circumferential direction differently from the orientation of the double spiral pattern 520 of the first magnetoresistive element 520b in the circumferential direction by about 90 degrees, the magnetic field detection anisotropy in each first magnetoresistive element is able to be significantly reduced or prevented.

In the magnetic sensor 500 according to the fifth preferred embodiment, each of the two second magnetoresistive elements 530a and 530b preferably includes the unit pattern that does not include a linearly extended section, is bent at each of the 15 bending sections $B_1$ through $B_{15}$, and includes a bag shape with the starting portion 570a and the terminating portion 570b as a mouth.

Thus, a current flowing through the unit pattern in various directions in the horizontal direction is able to be dispersed and the magnetoresistive effect anisotropy in each of the two second magnetoresistive elements 530a and 530b is able to be reduced. In addition, variation in the output of the magnetic sensor 500 due to the influence of residual magnetization at the time of the external magnetic field being about 0 is able to be significantly reduced or prevented.

The preferred embodiments disclosed herein are to be understood in all ways as exemplary and in no ways limiting. The scope of the present invention is defined by the appended claims rather than by the foregoing descriptions, and any meanings equivalent to the appended claims as well as all modifications made within the scope of the appended claims are intended to be encompassed in the invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A magnetic sensor comprising:
   a plurality of magnetoresistive elements electrically connected to each other to provide a bridge circuit; wherein
   the plurality of magnetoresistive elements includes a plurality of first magnetoresistive elements and a plurality of second magnetoresistive elements;

a resistance change rate of each of the plurality of first magnetoresistive elements is greater than a resistance change rate of each of the plurality of second magnetoresistive elements;

each of the plurality of first magnetoresistive elements includes a double spiral pattern in plan view;

the double spiral pattern includes a first spiral pattern, a second spiral pattern, and an S-shaped or inverted S-shaped pattern that joins the first spiral pattern and the second spiral pattern at a center portion of the double spiral pattern, the S-shaped or inverted S-shaped pattern including only a curvature portion; and orientations of the double spiral patterns of the plurality of first magnetoresistive elements differ from each other in a circumferential direction, and orientations of the S-shaped or inverted S-shaped patterns differ from each other in the circumferential direction.

2. The magnetic sensor according to claim 1, wherein:
the plurality of first magnetoresistive elements includes two first magnetoresistive elements; and
the orientations of the double spiral patterns of the two first magnetoresistive elements differ from each other in the circumferential direction by about 90 degrees, and the orientations of the S-shaped or inverted S-shaped patterns differ from each other by about 90 degrees in the circumferential direction.

3. The magnetic sensor according to claim 1, wherein:
the double spiral pattern includes length-adjustment redundant portions that adjust a length of the double spiral pattern in a circumference portion of the first spiral pattern and a circumference portion of the second spiral pattern;
the first spiral pattern and the second spiral pattern are respectively curved and folded back; and
the length-adjustment redundant portion provided in the first spiral pattern and the length-adjustment redundant portion provided in the second spiral pattern are positioned on opposite sides to each other in a radial direction of the double spiral pattern.

4. The magnetic sensor according to claim 1, wherein:
each of the plurality of second magnetoresistive elements includes at least one unit pattern that is defined by being folded back while including a plurality of bending sections; and
the unit pattern includes no linearly extended sections whose length is greater than about 10 µm.

5. The magnetic sensor according to claim 4, wherein the unit pattern is bent at each of the plurality of bending sections.

6. The magnetic sensor according to claim 4, wherein the unit pattern is curved at each of the plurality of bending sections.

7. The magnetic sensor according to claim 4, wherein:
each of the plurality of second magnetoresistive elements includes a plurality of the unit patterns; and
the plurality of unit patterns are arranged on or substantially on a virtual circle and are connected to each other.

8. The magnetic sensor according to claim 4, wherein:
each of the plurality of second magnetoresistive elements includes the plurality of unit patterns; and
the plurality of unit patterns are arranged on or substantially on a virtual polygon and are connected to each other.

9. The magnetic sensor according to claim 4, wherein:
each of the plurality of second magnetoresistive elements includes the plurality of unit patterns; and
the plurality of unit patterns are arranged on or substantially on a virtual straight line and are connected to each other.

10. The magnetic sensor according to claim 1, wherein the plurality of magnetoresistive elements provide a Wheatstone bridge circuit.

11. The magnetic sensor according to claim 1, further comprising a differential amplifier.

12. The magnetic sensor according to claim 11, wherein:
a first input terminal of the differential amplifier is connected to a first middle point between a first one of the plurality of first magnetoresistive elements and a second one of the plurality of second magnetoresistive elements; and
a second input terminal of the differential amplifier is connected to a second middle point between a second one of the plurality of first magnetoresistive elements and a first one of the plurality of second magnetoresistive elements.

13. The magnetic sensor according to claim 12, further comprising a temperature compensation circuit connected to an output terminal of the differential amplifier.

14. The magnetic sensor according to claim 13, further comprising a latch and switch circuit connected to an output terminal of the temperature compensation circuit.

15. The magnetic sensor according to claim 14, further comprising a complementary metal oxide semiconductor driver connected to an output terminal of the latch and switch circuit.

16. The magnetic sensor according to claim 1, wherein the plurality of magnetoresistive elements are provided in a single magnetic body layer.

17. The magnetic sensor according to claim 16, further comprising a conductive layer provided on at least a portion of the single magnetic body layer.

18. The magnetic sensor according to claim 16, wherein the single magnetic body layer is provided on a substrate.

19. The magnetic sensor according to claim 18, wherein each of the first magnetoresistive elements detects an external magnetic field in substantially all directions in a plane that is parallel or substantially parallel to a surface of the substrate.

* * * * *